United States Patent
Murayama

(10) Patent No.: US 6,344,695 B1
(45) Date of Patent: Feb. 5, 2002

(54) SEMICONDUCTOR DEVICE TO BE MOUNTED ON MAIN CIRCUIT BOARD AND PROCESS FOR MANUFACTURING SAME DEVICE

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/414,503

(22) Filed: Oct. 8, 1999

(30) Foreign Application Priority Data

Oct. 12, 1998 (JP) .............................. 10-289145

(51) Int. Cl.$^7$ ......................... H01L 23/48; H01L 23/52; H01L 29/40
(52) U.S. Cl. ...................... 257/781; 257/780; 438/613; 438/614
(58) Field of Search ................................ 257/780, 781, 257/783; 438/613, 614

(56) References Cited

U.S. PATENT DOCUMENTS

| | | | |
|---|---|---|---|
| 5,019,673 A | | 5/1991 | Juskey et al. |
| 5,668,399 A | * | 9/1997 | Cronin et al. |
| 5,740,956 A | | 4/1998 | Seo et al. |
| 5,943,597 A | * | 8/1999 | Kleffner et al. |
| 5,977,632 A | * | 11/1999 | Beddingfield |
| 6,198,169 B1 | * | 3/2001 | Kobayashi et al. |

FOREIGN PATENT DOCUMENTS

| | | |
|---|---|---|
| DE | 40 25 622 | 2/1992 |
| DE | 196 28 702 | 1/1997 |
| EP | 0 810 649 | 12/1997 |
| JP | 4-256343 | 9/1992 |

OTHER PUBLICATIONS

Powell et al., "Flip–Chip on FR–4 Integrated Circuit Packaging", Proceedings of the Electronic Components and Technology Conference, US, New York, IEEE vol. Conf. 43, pp. 182–186.

* cited by examiner

Primary Examiner—Sheila V. Clark
(74) Attorney, Agent, or Firm—Staas & Halsey LLP

(57) ABSTRACT

A semiconductor chip has an active surface with electrodes thereon and an insulating layer covering the active surface and having through holes therein through which corresponding electrodes are exposed. Rewiring circuits are formed on the insulating layer, each having a first terminal end extending through a corresponding through hole and electrically connected to a respective electrode and a second terminal end comprising a conductive pad. Respective inner bumps are formed on the second terminal ends of the rewiring circuits. An insulating film is formed on the rewiring circuits and exposed surfaces of the insulating layer and through holes are formed therein corresponding to the conductive pads and into which respective inner bumps are inserted. A respective outer bump is superimposed on each inner bump in the insulating film and projects beyond an exposed surface of the insulating film remote from the semiconductor chip. In an alternative, inner bumps are omitted and the outer bumps are directly superimposed on the conductive pads in the corresponding through holes. A method of making the semiconductor device provides for superimposing outer bumps either directly on the respective conductive pads in the corresponding through holes, where inner bumps are not employed, or superimposing same on the respective inner bumps after superimposing the inner bumps on the respective conductive pads.

20 Claims, 7 Drawing Sheets

SEMICONDUCTOR DEVICE TO BE MOUNTED ON MAIN CIRCUIT BOARD AND PROCESS FOR MANUFACTURING SAME DEVICE

BACKGROUND OF THE INVENTION

1. Field of the Invention

The present invention relates to a semiconductor device to be mounted on a main circuit board and a process for manufacturing the same.

2. Description of the Related Art

One example known in the prior art of such a semiconductor device as described above is illustrated in FIG. 14.

In this semiconductor device, conductive inner bumps 20 of a smaller diameter, each projected from an electrode (not shown) provided on an active surface of a semiconductor chip 10, are electrically connected to connection terminals 32 provided on the upper surface of a sub-circuit board 30 having substantially the same size as that of the semiconductor chip 10. A gap between the semiconductor chip 10 and the sub-circuit board 30 is filled with underfiller 40 so that the semiconductor chip 10 is bonded to the sub-circuit board 30. Conductive pads 34 are provided on the lower surface of the sub-circuit board 30. The conductive pads 34 are electrically connected via circuit patterns (not shown) of the sub-circuit board 30 to connecting terminals 32 on the upper surface of the sub-circuit board 30. A conductive outer bump 60 of a larger diameter having a hemispherical shape is projected from each of the conductive pads 34 for the electrical connection to a connection terminal 52 on the upper surface of a main circuit board 50.

According to this semiconductor device, it is possible to electrically connect a plurality of electrodes of various kinds formed at a small pitch in the peripheral region of the active surface of the semiconductor chip 10, via the inner bumps 20 and the circuit patterns of the sub-circuit board 30, with a plurality of conductor pads 34 provided on the lower surface of the sub-circuit board 30 at a large pitch in a matrix manner. And, it is possible to replace a plurality of electrodes arranged at a small pitch in the peripheral region of the active surface of the semiconductor chip 10 for the electrical connection to the connection terminals 52 on the upper surface of the main circuit board 50, with the conductive pads 34 arranged at a large pitch on the lower surface of the sub-circuit board 30 in a matrix manner. Together therewith, it is also possible to electrically connect selected electrodes formed on the active surface of the semiconductor chip 10 to each other via circuit patterns of the sub-circuit board 30.

It is possible to form a generally semispherical outer bump 60 of a larger diameter on each of the conductive pads 34 arranged at a large pitch in a matrix manner or the like, while maintaining a predetermined distance from the other outer bump 60 to avoid the contact with the other outer bumps 60 formed on the adjacent conductor pads 34. Then the plurality of generally hemispherical outer bumps 60 of a larger diameter could be easily and assuredly electrically connected to the plurality of connection terminals 52 arranged on the upper surface of the main circuit board 50 at a larger pitch in a matrix manner or the like. Thus, it is possible to electrically connect the plurality of electrodes on the active surface of the semiconductor chip 10 to the respective connection terminals 52 on the upper surface of the main circuit board 50 corresponding thereto.

The above-described known semiconductor device, however, has a drawback in that the semiconductor chip 10 is mounted on the main circuit board 50 via the sub-circuit board 30 having a larger occupation volume, resulting in the increase in size of the semiconductor device.

Further, the production thereof is troublesome because the semiconductor chip 10 must be bonded to the circuit board 30 via the underfiller 40.

Also, since the sub-circuit board 30 is complicated in structure, the production cost of the semiconductor device increases.

SUMMARY OF THE INVENTION

An object of the present invention is to provide a semiconductor device capable of eliminating such a problem in the prior art, which has no sub-circuit board to minimize a size thereof and reduce the production cost, and a process for manufacturing the same.

According to the present invention, there is provided a semiconductor device comprising: a semiconductor chip having an electrode and also having an active surface covered with an insulating layer; a rewiring circuit formed on the insulating layer, the rewiring circuit electrically connected to the electrode; an inner bump formed on a conductive pad which is a part of the rewiring circuit; an insulating film attached to the rewiring circuit and a surface of the insulating layer at a peripheral portion of the rewiring circuit, the insulating film having a through hole into which the inner bump is inserted; and an outer bump superimposed on the inner bump in the through hole so as to project to an outside opposite to the semiconductor chip.

The through hole is tapered so that cross-section area thereof is gradually larger toward the outside.

The outer bump is made of an eutectic solder, such as composed of 63 weight % of Sn and 37 weight % of Pb.

According to another aspect of the present invention, there is provided a semiconductor device comprising; a semiconductor chip having an electrode and also having an active surface covered with an insulating layer; a rewiring circuit formed on the insulating layer, the rewiring circuit electrically connected to the electrode; a conductive pad formed as a part of the rewiring circuit; an insulating film attached to the rewiring circuit and a surface of the insulating layer at a peripheral portion of the rewiring circuit, the insulating film having a through hole so that the conductive pad is exposed in the through hole; and an outer bump superimposed on the conductive pad in the through hole so as to project to an outside opposite to the semiconductor chip.

According to still another aspect of the present invention, there is provided a process for manufacturing a semiconductor device, the process comprising the following steps of: covering an active surface of a semiconductor chip with an insulating layer; forming a rewiring circuit on the insulating layer so that the rewiring circuit is electrically connected to an electrode of the semiconductor chip; forming an inner bump of a high melting point material on a conductive pad which is a part of the rewiring circuit; attaching an insulating film to the rewiring circuit and a surface of the insulating layer at a peripheral portion of the rewiring circuit, the insulating film having a through hole into which the inner bump is inserted; and superimposing an outer bump on the inner bump in the through hole so as to project to an outside opposite to the semiconductor chip.

According to still another aspect of the present invention, there is provided a process for manufacturing a semiconductor device, the process comprising the following steps of:

covering an active surface of a semiconductor chip with an insulating layer; forming a rewiring circuit on the insulating layer so that the rewiring circuit is electrically connected to an electrode of the semiconductor chip; forming a conductive pad formed as a part of the rewiring circuit; attaching an insulating film to the rewiring circuit and a surface of the insulating layer at a peripheral portion of the rewiring circuit, the insulating film having a through hole so that the conductive pad is exposed in the through hole; and superimposing an outer bump on the conductive pad in the through hole so as to project to an outside opposite to the semiconductor chip.

BRIEF DESCRIPTION OF THE DRAWINGS

FIGS. 1 to 3 illustrate a structure of a first semiconductor device according to the present invention, wherein FIG. 1 is a side sectional view of an overall structure thereof, and FIGS. 2 and 3 are partially enlarged views thereof, respectively;

FIGS. 11 to 13 illustrate a structure of a second semiconductor device according to the present invention, wherein FIG. 11 is a side sectional view of an overall structure thereof, FIG. 12 illustrates a process for producing the second semiconductor device, and FIG. 13 is a partially enlarged view thereof, respectively.

DETAILED DESCRIPTION OF THE EMBODIMENTS

The present invention will now be described in more detail with reference to the preferred embodiments illustrated in the attached drawings.

Figure 1:
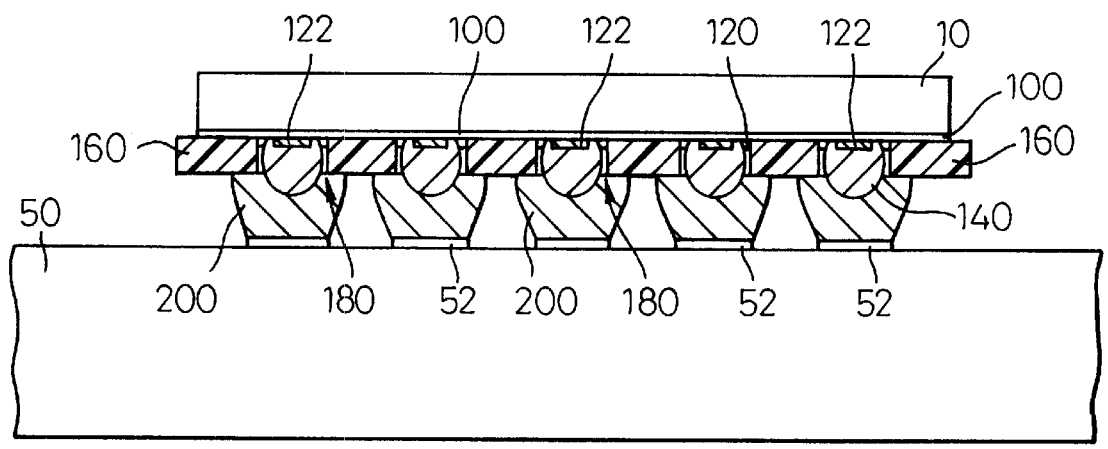
Figure 2:
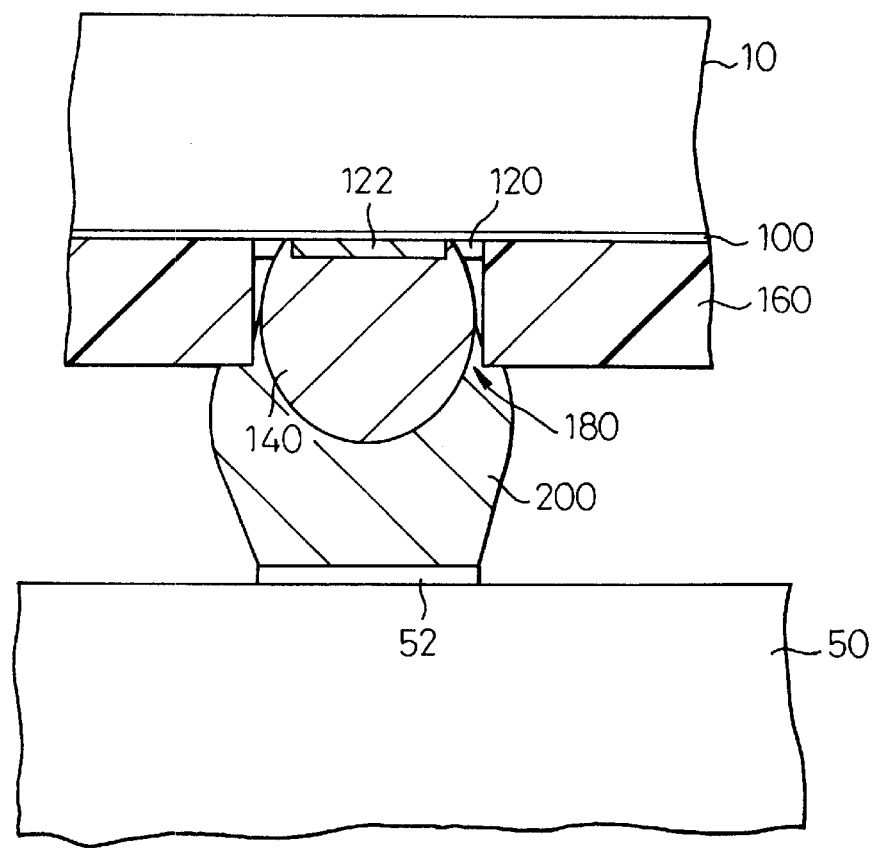
Figure 3:
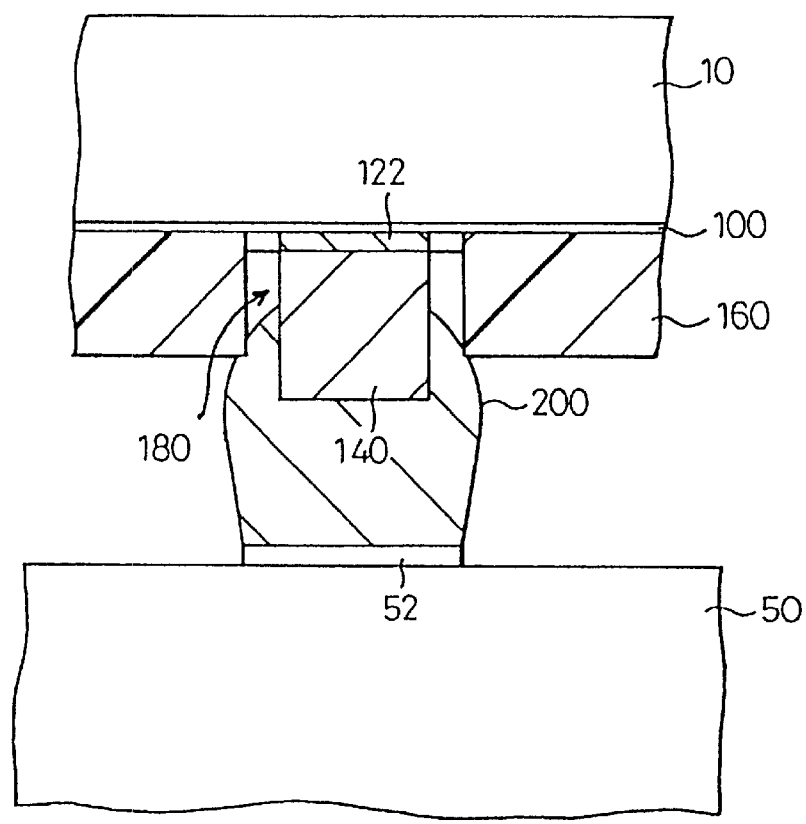

FIGS. 1 to 3 show a first embodiment of a semiconductor device according to the present invention, wherein FIG. 1 is an illustration for explaining a structure thereof; FIG. 2 is an enlarged view of part thereof; and FIG. 3 is an enlarged illustration for explaining the structure thereof.

In this first embodiment, an active surface of a semiconductor chip 10 is covered with a thin protective insulation layer 100 of polyimide resin or others. Rewiring circuits 120 mainly composed of Cu or others and electrically connected to electrodes (not shown) on the active surface of the semiconductor chip 10 are formed on a surface of the insulation layer 100. Disk-like conductor pads 122 are formed on part of the rewiring circuits 120.

As shown in FIG. 2, a generally semispherical inner bump 140 of smaller diameter made of conductor with a high melting point is projected from the conductor pad 122. Or, as shown in FIG. 3, generally cylindrical inner bump 140 of a smaller diameter formed of a plated conductor layer having a high melting point is projected therefrom. The inner bump 140 may be formed by using, for example, solder composed of 10% by weight of Sn and 90% by weight of Pb.

A surface of the rewiring circuit 120 and the insulation layer 100 in the peripheral region of the former are continuously covered with an insulation film 160. The insulation film 160 may be a film of polyimide resin coated on the back surface with an insulating adhesive.

Perforations or through holes 180 are provided in the insulation film 160, into which are inserted the inner bumps 140, respectively. An upper (lower in FIGS. 1 to 3) portion of the respective inner bump 140 reaches a plane flush with the surface of the insulation film 160 or even projects outside the plane.

A semispherical outer bump 200 of a larger diameter made of conductor having a low melting point is superposed on the inner bump 140 in a region of the insulation film 160 in which the perforation 180 is provided with the upper portion thereof projecting outside the insulation film 160. The outer bump 200 is made, for example, of eutectic solder composed of 63% by weight of Sn and 37% by weight of Pb.

In this semiconductor device, as shown in FIG. 1, it is possible to electrically connect a plurality electrodes arranged at a small pitch on the active surface of the semiconductor chip 10 to a plurality of outer bumps 200 formed to be projected outside the insulation film 160 in which the perforations 180 are formed at a large pitch in a matrix manner, via the rewiring circuits 120 and the inner bumps 140. The plurality of outer bumps 200 are electrically connectable in an easy and reliable manner to the plurality of connection terminals 52 arranged at a large pitch in a matrix manner on the upper surface of the main circuit board 50 corresponding thereto. Thus, the plurality of electrodes of various kinds on the active surface of the semiconductor chip 10 are electrically connectable to the plurality of connection terminals 52 on the upper surface of the main circuit board 50 corresponding thereto.

Together therewith, it is possible to electrically connect predetermined electrodes on the active surface of the semiconductor chip 10 to each other via the rewiring circuits 120.

Next, a first preferred embodiment of a process for manufacturing a semiconductor device according to the present invention will be explained below, wherein the first semiconductor device described above is manufactured, with reference to the drawings FIGS. 4 to 8 illustrate a process for manufacturing the first semiconductor device according to the present invention.

Figure 4:
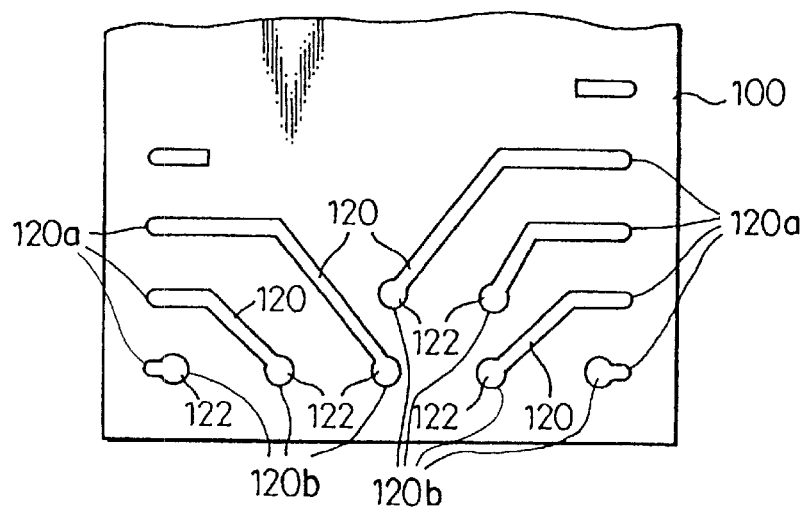
FIGS. 4 to 8 illustrate a process for manufacturing the first semiconductor device according to the present invention.
Figure 5:
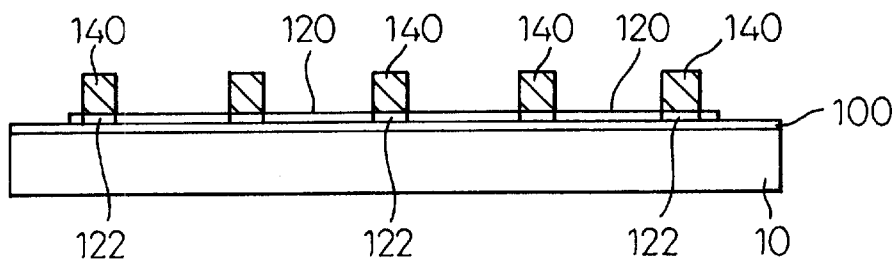
Figure 6:
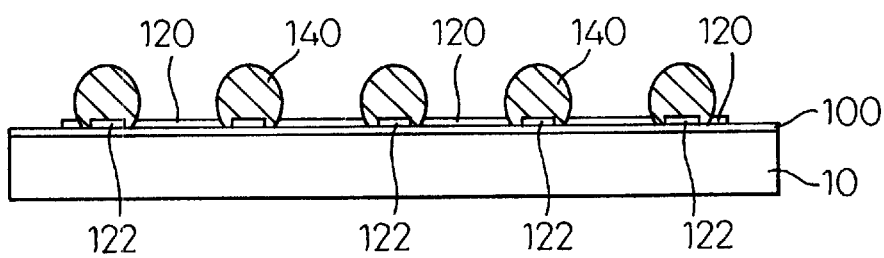

In the process for manufacturing the first semiconductor device, the active surface of the semiconductor chip 10 is covered with the insulation layer 100 as shown in FIGS. 4 to 6. More concretely, polyimide resin or others is coated on the active surface of the semiconductor chip 10 to form a thin layer, and cured thereafter.

The rewiring circuits 120 are formed on a surface of the insulation layer 100.

Perforations (not shown) are formed in the insulation layer 100 at positions directly above the electrodes provided on the active surface of the semiconductor chip 10 so that the electrodes of the semiconductor chip 10 are present in the bottom of the perforations. Part of the rewiring circuit 120 is continued to the electrode of the semiconductor chip 10 present in the bottom of the perforation. Thus, the rewiring circuit 120 is electrically connected to the electrode of the semiconductor chip 10.

The conductor pads 122 of a circular shape or the like are formed in part of the rewiring circuits 120. The inner bump 140 made of conductor having a high melting point is projectingly formed on the conductor pad 122 as shown in FIG. 5 or 6. The inner bump 140 shown in FIG. 5 is of a generally cylindrical shape formed of a plated layer of solder composed of 10% by weight of Sn and 90% by weight of Pb. On the other hand, the inner bump 140 shown in FIG. 6 is of a generally semispherical shape formed by the reflow of the above-mentioned plated layer of solder.

Figure 7:
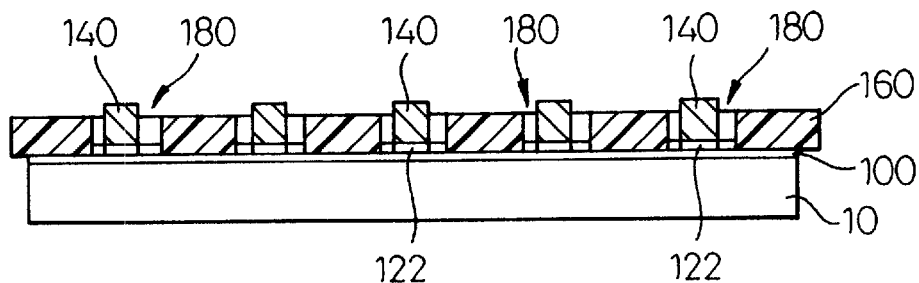
Figure 8:
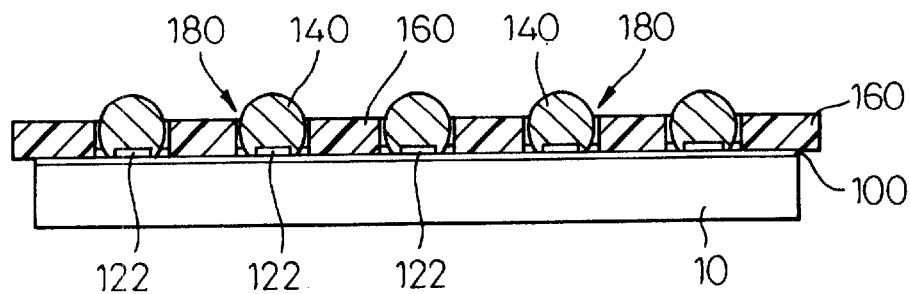

Thereafter, as shown in FIG. 7 or 8, the insulation film 160 is continuously bonded onto the rewiring circuits 120 and a surface of the insulation layer 100 in the peripheral region thereof. The inner bumps 140 formed on the respective conductor pads 122 are inserted into the respective perforations 180 provided in the insulation film 160 at a large pitch in a matrix manner. As the insulation film 160, for example, a film of polyimide resin coated on the back surface thereof with an insulation adhesive may be used.

Then, at positions of the insulation film 160 at which the respective perforations are formed, the semispherical outer bumps 200 of a large diameter made of a low melting point conductor are superposed on the inner bumps 140 inserted into the perforations, respectively, while exposing the upper part thereof outside the insulation film 160, as shown in FIG. 3. The outer bump 200 may be made, for example, of eutectic solder composed of 63% by weight of Sn and 37% by weight of Pb. Thus, the first semiconductor device as shown in FIGS. 1 to 3 is obtained.

In the above-mentioned first process for manufacturing semiconductor device, it is possible by the insulation film 160 to prevent the outer bump 200 from being in contact with part of the rewiring circuit 120 formed on the surface of the insulation layer 100 covering the active surface of the semiconductor chip 10, when the outer bump 200 is formed at a position corresponding to the perforation 180 of the insulation film 160 so that the upper part thereof is projected outside the insulation film 160. Thus, it is possible to prevent part of the rewiring circuit 120 from being short-circuited via the outer bump 200.

It is possible to prevent the inner bump 140 from melting to get out of shape or disappear while mixing with the outer bump 200, when the outer bump 200 made of low melting point material is superposed on the inner bump 140 inserted into the perforation 180, since the inner bump 140 is made of high melting point material.

Since the inner bump 140 projected from the conductor pad 122 is inserted into the perforation 180 provided in the insulation film 160 so that the upper part of the inner bump 140 is located in the vicinity of the surface of the insulation film 160 or projected outside the insulation film 160, it is possible to easily and reliably superpose the outer bump 200 formed at a position corresponding to the perforation 180 of the insulation film 160 on the inner bump 140 without being interfered with the insulation film 160.

Figure 9:
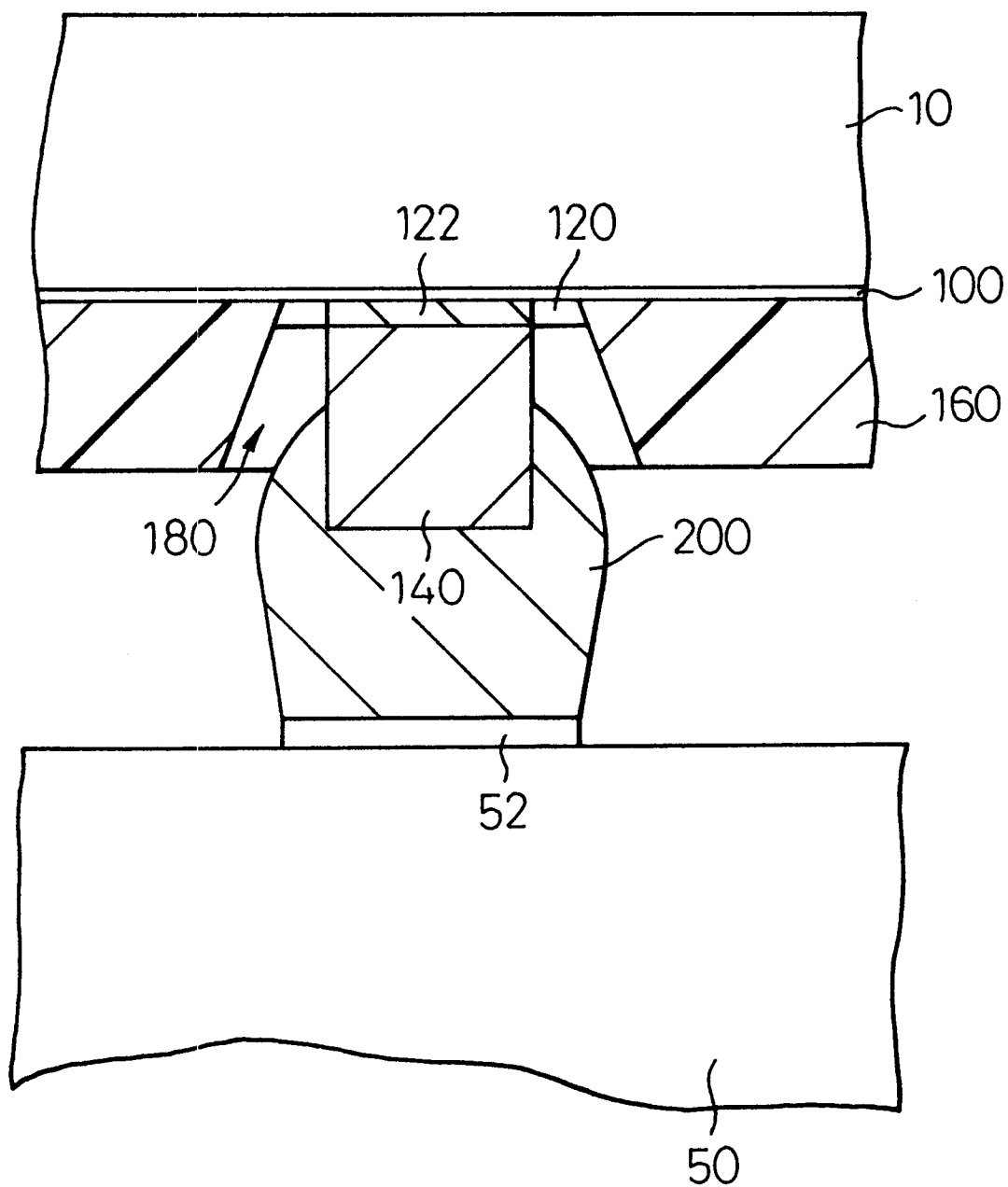
FIGS. 9 and 10 illustrate partially enlarged views of the first semiconductor device according to the present invention.
Figure 10:
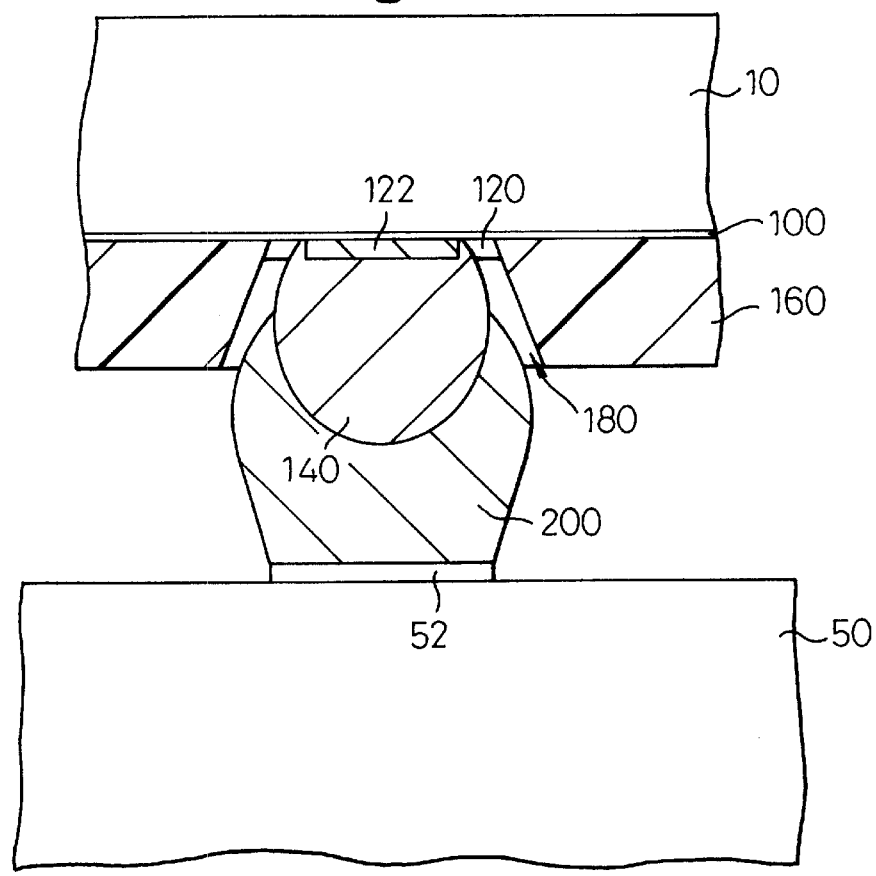

As shown in FIG. 9 or 10, the perforation 180 is preferably of a trumpet shape diverging toward outside of the insulation film 160.

If the perforation 180 has such a trumpet shape, the upper portion of the inner bump 140 inserted into the perforation 180 can be located in an upper wider space diverged toward outside of the insulation film 160. Thus, it is possible to easily and reliably superpose the outer bump 200 on the upper part of the inner bump 140 located in the upper wider space of the perforation 180 without being interfered with the insulation film 160, resulting in a thick connection between both the bumps.

Figure 11:
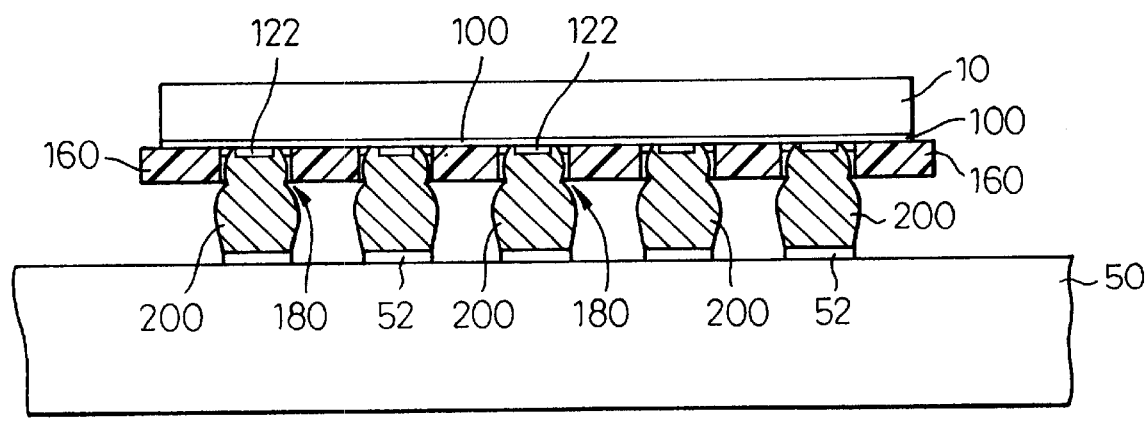

FIG. 11 illustrates a structure of a second preferred embodiment of a semiconductor device according to the present invention.

In the second semiconductor device, the conductor pad 122 formed as part of the rewiring circuit 120 is present on the bottom of the perforation 180 provided in the insulation film 160 continuously covering the rewiring circuit 120 and a surface of the insulation layer 100 in the peripheral region of the rewiring circuit.

The generally semispherical outer bump 200 made of high melting point conductor to have a large diameter is directly connected to the conductor pad 122 present on the bottom of the perforation with the upper portion of the bump projecting outside of the insulation film 160.

The remaining structure is the same as that of the first semiconductor device, and the operation thereof is also similar to that of the first semiconductor device except for that resulted from a fact that, in the first semiconductor device, the outer bump 200 is connected to the conductor pad 122 via the inner bump 140.

Figure 12:
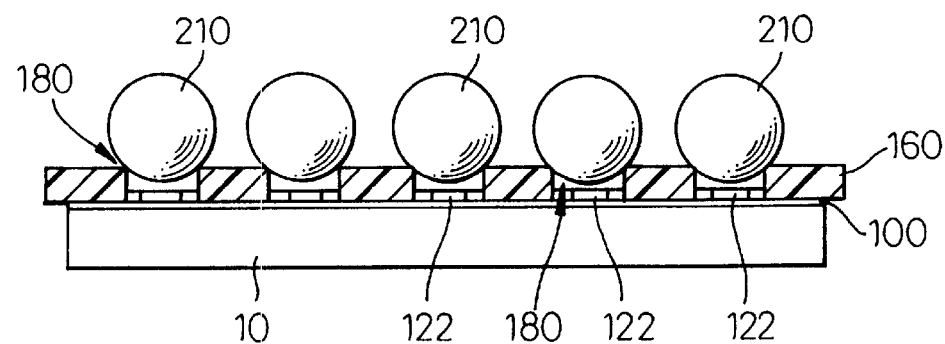

FIG. 12 illustrates a second embodiment of a process for manufacturing a semiconductor device according to the present invention.

In this process for manufacturing the second semiconductor device, balls 210 to be converted to the outer bumps 200, made of conductor such as solder or others, are placed on the outer surface of the insulation film 160 at positions corresponding to the perforations 180 as shown in FIG. 12.

Then, the balls 210 are heated and melted. A lower portion of the molten ball 210 is brought into contact with the conductor pad 122 present on the bottom of the perforation 180 provided in the insulation film 160 due to gravity applied to the ball. Thus, the generally hemispherical outer bump 200 having a large diameter is formed at a position corresponding to the perforation 180 provided in the insulation film 160, with the upper portion projecting outside the insulation film 160 and the lower portion being connected to the conductor pad 122 present on the bottom of the perforation 180, as shown in FIG. 11.

The remaining process is same as that of the first method for the production of the semiconductor device, and the operation thereof is also similar to that of the first method except for that resulted from a fact that, in the first semiconductor device, the outer bump 200 is connected to the conductor pad 122 via the inner bump 140.

Figure 13:
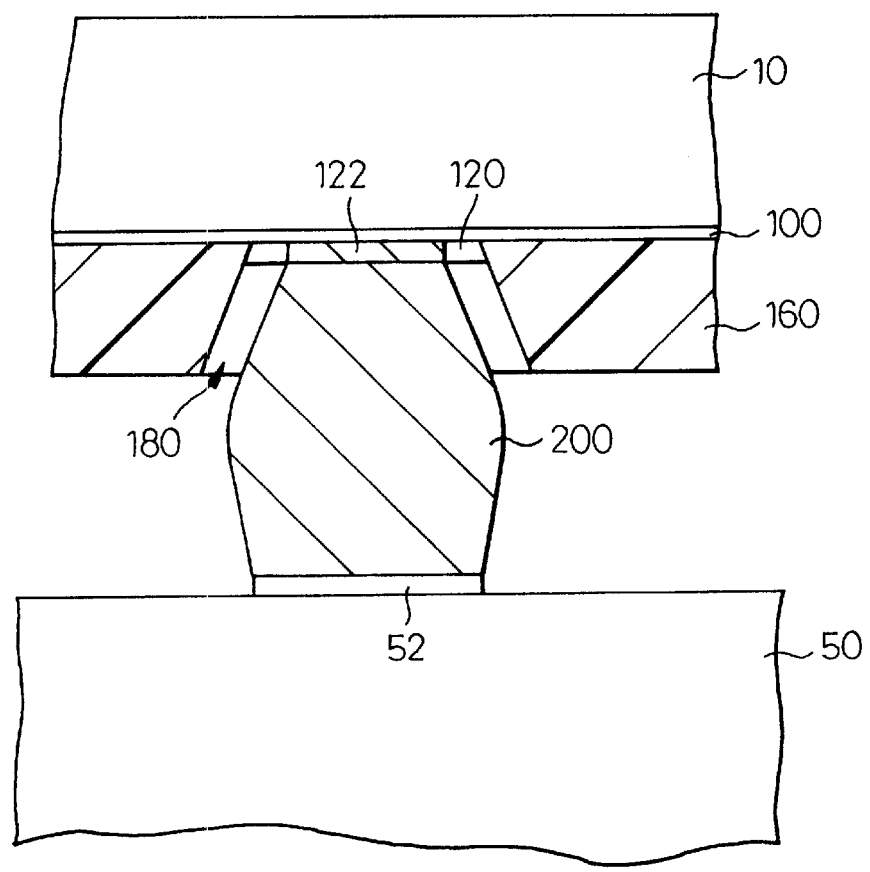
Figure 14:
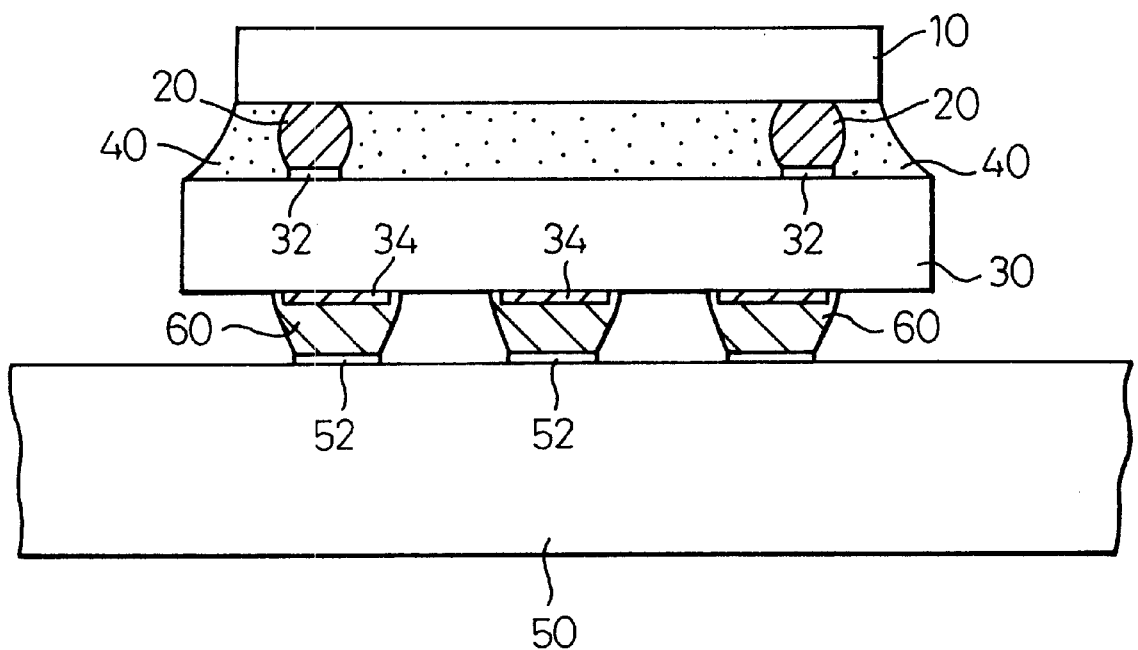
FIG. 14 illustrates a structure of a prior art semiconductor device.

In the above-mentioned second semiconductor device, the perforation 180 is preferably of a trumpet shape diverged toward the outside of the insulation film 160 as shown in FIG. 13.

If the perforation 180 is of such a trumpet shape, it is possible to easily, reliably and thickly superpose the outer bump 200 formed at a position corresponding to the perforation 180 in the insulation film 160 on the conductor pad 122 present on the bottom of the perforation 180 without the interference of the insulation film 160. Thus, the electric connection of the outer bump 200 to the conductive bump 122 is easily and reliably achievable.

As described above, according to the semiconductor device and the method for the production thereof of the present invention, it is possible to eliminate the sub-circuit board which has been indispensable in the prior art semiconductor device and, instead, replace the same with the insulation layer, the rewiring circuit and the insulation film which have an extremely small volume and are easily processed. Thus, the semiconductor device can be minimized in size and easily produced at a lower manufacturing cost.

What is claimed is:

1. A semiconductor device comprising:
   a semiconductor chip having an active surface with electrodes thereon and an insulating layer covering the active surface and having through holes therein through which corresponding electrodes are exposed;
   rewiring circuits formed on the insulating layer, each rewiring circuit having a first terminal end, extending through a corresponding through hole and electrically connected to a respective electrode, and a second terminal end comprising a conductive pad;

a respective inner bump formed on the second terminal end of each rewiring circuit;

an insulating film formed on the rewiring circuits and exposed surfaces of the insulating layer and having a through hole therein corresponding to each conductive pad and into which the respective inner bump is inserted;

a respective outer bump superimposed on each inner bump inserted in a corresponding through hole in the insulating film and projecting beyond an exposed surface of the insulating film, remote from the semiconductor chip; and a spacing on the insulating film between adjacent outer bumps being greater than a spacing on the active surface between adjacent electrodes.

2. A semiconductor device as set forth in claim 1, wherein each through hole in the insulating film is tapered so that a cross-sectional area thereof is gradually larger toward the exposed surface thereof remote from the semiconductor chip.

3. A semiconductor device as set forth in claim 1, wherein each outer bump is made of an eutectic solder, composed of 63 weight % of Sn and 37 weight % of Pb.

4. A semiconductor device, comprising:

a semiconductor chip having an active surface with electrodes thereon and an insulating layer covering the active surface and having through holes therein through which corresponding electrodes are exposed;

rewiring circuits formed on the insulating layer, each rewiring circuit having a first terminal end, extending through a corresponding through hole and electrically connected to a respective electrode, and a second terminal end comprising a conductive pad;

a respective conductive pad formed as a part of each rewiring circuit;

an insulating film formed on the rewiring circuits and exposed surfaces of the insulating layer and having a through hole corresponding to each conductive pad and through which the conductive pad is exposed;

a respective outer bump superimposed on each conductive pad in a corresponding through hole so and projecting beyond an exposed surface of the insulating film remote from the semiconductor chip; and a spacing on the insulating film between adjacent outer bumps being greater than a spacing on the active surface between adjacent electrodes.

5. A semiconductor device as set forth in claim 4, wherein each through hole in the insulating film is tapered so that cross-sectional area thereof is gradually larger toward the exposed surface thereof remote from the semiconductor chip.

6. A semiconductor device as set forth in claim 4, wherein each outer bump is made of an eutectic solder, composed of 63 weight % of Sn and 37 weight % of Pb.

7. A process for manufacturing a semiconductor device, the process comprising:

covering an active surface of a semiconductor chip having electrodes with an insulating layer;

forming rewiring circuits having respective conductive pads on the insulating layer, each of the rewiring circuits being electrically connected on one side to a respective electrode of the semiconductor chip;

forming inner bumps of a high melting point material on respective conductive pads of the rewiring circuits;

forming an insulating film on the rewiring circuits and exposed surfaces of the insulating layer, the insulating film having respective through holes into which each of the inner bumps is inserted;

superimposing an outer bump on each of the inner bumps in each of the respective through holes of the insulating film, the outer bump projecting beyond the insulating film, remote from the semiconductor chip; and forming a spacing on the insulating film between adjacent outer bumps, the spacing between adjacent outer bumps being greater than a spacing on the active surface of the semiconductor chip between respective, adjacent electrodes.

8. A process as set forth in claim 7, further comprising a step of forming the through hole as tapered so that cross-section area thereof is gradually larger toward the outside.

9. A process for manufacturing a semiconductor device, the process comprising:

covering an active surface of a semiconductor chip with an insulating layer;

forming rewiring circuits on the insulating layer, each of the rewiring circuits being electrically connected to a respective electrode formed on the surface of the semiconductor chip and projecting through holes in the insulating layer, the rewiring circuits each having a respective conductive pad;

forming an insulating film on the rewiring circuits and surfaces of the insulating layer at a peripheral portion of the rewiring circuits, the insulating film having respective through holes corresponding to respective conductive pads;

superimposing a respective outer bump on each conductive pad in each of the corresponding through holes in the insulating film, the outer bumps projecting beyond a surface of the insulating film, remote from the semiconductor chip; and forming a spacing on the insulating film between adjacent outer bumps, the spacing between adjacent outer bumps being greater than a spacing on the active surface of the semiconductor chip between respective, adjacent electrodes.

10. A process as set forth in claim 9, further comprising a step of forming the through hole as tapered so that cross-section area thereof is gradually larger toward the outside.

11. A process for manufacturing a semiconductor device, comprising:

covering an active surface of a semiconductor chip having electrodes thereon with an insulating layer and forming through holes in the insulating layer through which corresponding electrodes are exposed;

forming rewiring circuits on the insulating layer, each rewiring circuit having a first terminal end, extending through a corresponding through hole and electrically connected to a respective electrode of the semiconductor chip, and a second terminal end comprising a conductive pad;

forming a respective inner bump of a high melting point material on the second terminal end of each rewiring circuit;

forming an insulating film on the rewiring circuits and exposed surfaces of the insulating layer and forming through holes corresponding to respective conductive pads and into which corresponding inner bumps are inserted, contacting the respective conductive pads;

superimposing an outer bump on each inner bump, projecting therefrom to and beyond an exposed surface of the insulating film remote from the semiconductor chip; and forming a spacing on the insulating film between adjacent outer bumps, the spacing between adjacent outer bumps being greater than a spacing on the active surface of the semiconductor chip between respective, adjacent electrodes.

12. A process as set forth in claim 11, further comprising forming each through hole of a tapered configuration and having a cross-sectional area increasing in a direction toward the exposed surface of the insulating film remote from the semiconductor chip.

13. A process as set forth in claim 12, further comprising forming the outer bumps with a spacing on the insulating film between adjacent outer bumps greater than a spacing on the active surface of the semiconductor chip between respective, adjacent electrodes.

14. A process as set forth in claim 11, further comprising forming the outer bumps with a spacing on the insulating film between adjacent outer bumps greater than a spacing on the active surface of the semiconductor chip between respective, adjacent electrodes.

15. A process for manufacturing a semiconductor device, comprising:

covering an active surface of a semiconductor chip having electrodes thereon with an insulating layer and forming through holes in the insulating layer through which corresponding electrodes are exposed;

forming rewiring circuits on the insulating layer, each rewiring circuit having a first terminal end, extending through a corresponding through hole and electrically connected to a respective electrode of the semiconductor chip, and a second terminal end comprising a conductive pad;

forming an insulating film on the rewiring circuits and exposed surfaces of the insulating layer and forming through holes in the insulating layer corresponding to respective conductive pads;

forming a respective bump of a conductive material on each conductive pad, projecting therefrom to and beyond an exposed surface of the insulating film remote from the semiconductor chip; and forming a spacing on the insulating film between adjacent bumps, the spacing between adjacent bumps being greater than a spacing on the active surface of the semiconductor chip between respective, adjacent electrodes.

16. A process as set forth in claim 15, further comprising forming each through hole of a tapered configuration and having a cross-sectional area increasing in a direction toward the exposed surface of the insulating film remote from the semiconductor chip.

17. A process as set forth in claim 7, further comprising forming a plurality of the outer bumps into a matrix formation with predetermined distances between each of the outer bumps.

18. A process as set forth in claim 9, further comprising forming a plurality of the outer bumps into a matrix formation with predetermined distances between each of the outer bumps.

19. A process as set forth in claim 11, further comprising forming the outer bumps into a matrix formation with predetermined distances between each of the outer bumps.

20. A process as set forth in claim 15, further comprising forming the bumps into a matrix formation with predetermined distances between each of the bumps.

* * * * *

UNITED STATES PATENT AND TRADEMARK OFFICE
CERTIFICATE OF CORRECTION

PATENT NO.     : 6,344,695 B1
DATED          : February 5, 2002
INVENTOR(S)    : Kei Murayama It is certified that error appears in the above-identified patent and that said Letters Patent is hereby corrected as shown below:

Column 2,
Line 15, after "board" insert -- , thereby --.

Column 3,
Lines 15 and 23, after "first" insert -- embodiment of a --;
Lines 25 and 29, after "second" insert -- embodiment of a --;
Line 48, change "others and" to -- other conductive materials and --;
Line 52, change "on part" to -- on, or as, respective terminal parts --;
Line 55, change "projected from the" to -- formed on and projects from each respective --;
Line 56, after "FIG. 3" insert -- a --;
Line 62, change "A surface" to -- Surfaces -- and, after "and" insert -- exposed portions of --.
Line 63, after "100" insert -- , -- and after "former" insert -- , --.

Column 4,
Line 4, change "the respective" to -- each --;
Line 5, after "outside" insert -- , i.e., beyond --;
Line 9, change "the" to -- each respective --;
Line 10, after "the" (first occurrence) insert -- corresponding --;
Line 11, after "outside" insert -- (i.e., beyond) --;
Line 15, after "plurality" insert -- of --;
Line 17, after "of" insert -- respective --.
Line 18, change "be projected outside" to -- project outside (i.e., beyond) -- and after "160" insert -- , --;
Line 19, after "the" insert -- corresponding -- and after "formed" insert -- , --;
Lines 23 and 27, after "of" insert -- respective --;
Lines 38 and 40, after "first" insert -- embodiment of a --;
Line 43, change "others" to -- other conductive material --;
Line 52, change "bottom" to -- bottoms -- and change "Part of the rewriting circuit" to -- Respective terminal ends 120a of the rewriting circuits --;
Line 53, change "is continued" to -- extend through the corresponding perforations and are connected -- and change "electrode" to -- electrodes --;
Line 54, change "bottom of the perforation" to -- bottoms of the corresponding perforations --;
Line 55, change "circuit 120 is" to -- circuits 120 are -- and change "electrode" to -- electrodes --;
Line 58, change "in part" to -- as, or on, opposite terminal ends 120b -- and change "The" (second occurrence) to -- Each --;
Line 59, change "140 made of conductor" to -- 140 is made of a conductor -- and after "point" insert -- and --;

UNITED STATES PATENT AND TRADEMARK OFFICE
CERTIFICATE OF CORRECTION

PATENT NO. : 6,344,695 B1
DATED : February 5, 2002
INVENTOR(S) : Kei Murayama

It is certified that error appears in the above-identified patent and that said Letters Patent is hereby corrected as shown below:

Column 4, (continued)
Line 60, after "the" insert -- corresponding --;
Line 61, change "The" to -- Each -- and after "140" insert -- , as --;
Line 62, after "shape" insert -- and is --.

Column 5,
Line 3, change "a surface" to -- exposed surfaces -- and delete "the peripheral";
Line 4, delete "region thereof" and after "140" insert -- are --;
Line 5, change "are inserted into" to -- by being inserted into and through --;
Lines 11 and 14, after "perforations" insert -- 180 --;
Line 15, after "outside" insert -- of and projecting from --;
Line 16, change "bump" to -- bumps --;
Line 21, before "semiconductor" insert -- a -- and after "possible" insert -- , --;
Line 22, after "160" insert -- , --;
Line 26, change "the perforation 180 of the" to -- the respective perforation 180 in the --;
Line 28, after "outside" insert -- (i.e., projects beyond) --;
Line 32, change "to get out" to -- , and getting out -- and change "or disappear" to -- or even disappearing --;
Line 33, after "of" insert -- a --;
Line 37, change "projected" to -- projecting --;
Line 40, after "located" insert -- either --;
Line 41, change "projected" to -- so as to project --;
Line 42, after "200" insert -- , --;
Line 44, delete "being";
Line 45, change "interfered" to -- interfering --;
Line 46, change "FIG. 9 or 10" to -- FIGS. 9 and 10 --;
Line 47, after "shape" insert -- , -- and change "toward outside" to -- toward the outside surface --;
Line 51, change "diverged" to -- which diverges --;
Line 52, change "outside" to -- the outside, or exterior, surface --;
Line 55, after "with" insert -- by --;
Line 61, after "second" insert -- embodiment of a -- and change "device, the conductor" to -- device of FIG. 11, each conductor --;
Line 62, after "122" insert -- is --, after "the" insert -- respective -- and delete "is";
Line 63, change "the perforation" to -- the corresponding perforation --;
Line 65, change "a surface" to -- exposed surfaces -- and delete "in the peripheral region";
Line 66, delete "of the rewiring circuit";

UNITED STATES PATENT AND TRADEMARK OFFICE
CERTIFICATE OF CORRECTION

PATENT NO. : 6,344,695 B1
DATED : February 5, 2002
INVENTOR(S) : Kei Murayama

It is certified that error appears in the above-identified patent and that said Letters Patent is hereby corrected as shown below:

<u>Column 6,</u>
Line 1, change "The" to -- Each -- and after "200" insert -- , --;
Line 2, after "diameter" insert -- , --;
Line 4, after "the" (first occurrence) insert -- corresponding --;
Line 5, after "of" insert -- , i.e., beyond the surface of, --;
Line 8, change "device except for" to -- device embodiment --;
Line 9, delete "that resulted from a fact";
Line 10, change "device, the outer" to -- device embodiment, each outer --;
Line 11, change "the" to -- a respective --;
Line 15, change "second" insert -- embodiment --;
Line 16, change "the" to -- respective --;
Line 21, change "the molten" to -- each molten -- and "contact with the" to -- contact with the corresponding --;
Line 22, before "perforation" insert -- respective --;
Line 25, change "a position" to -- the position of the --;
Line 26, delete "to the";
Line 27, after "outside" insert -- (i.e., beyond the exposed surface of) --;
Line 34, delete "for that resulted from a fact" and after "first" insert -- embodiment of a --;
Line 37, after "second" insert -- embodiment of a --;
Line 38, change "diverged" to -- diverging --;
Line 43, "after "200" insert -- , --;
Line 44, after "160" insert -- , --;
Line 52, delete "the";
Line 53, change "device and, instead, replace" to -- devices and, instead, to replace --.

Signed and Sealed this

Third Day of September, 2002

*Attest:*

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO.    : 6,344,695 B1
DATED         : February 5, 2002
INVENTOR(S)   : Kei Murayama It is certified that error appears in the above-identified patent and that said Letters Patent is hereby corrected as shown below:

Column 2,
Line 15, after "board" insert -- , thereby --.

Column 3,
Lines 15 and 23, after "first" insert -- embodimnet of a --;
Lines 25 and 29, after "second" insert -- embodiment of a --;
Line 48, change "others and" to -- other conductive materials and --;
Line 52, change "on part" to -- on, or as, respective terminal parts --;
Line 55, change "projected from the" to -- formed on and projects from each respective --;
Line 56, after "FIG. 3" insert -- a --;
Line 62, change "A surface" to -- Surfaces -- and, after "and" insert -- exposed portions of --.
Line 63, after "100" insert -- , -- and after "former" insert -- , --.

Column 4,
Line 4, change "the respective" to -- each --;
Line 5, after "outside" insert -- , i.e., beyond --;
Line 9, change "the" to -- each respective --;
Line 10, after "the" (first occurrence) insert -- corresponding --;
Line 11, after "outside" insert -- (i.e., beyond) --;
Line 15, after "plurality" insert -- of --;
Line 17, after "of" insert -- respective --.
Line 18, change "be projected outside" to -- project outside (i.e., beyond) -- and after "160" insert -- , --;
Line 19, after "the" insert -- corresponding -- and after " formed" insert -- , --;
Lines 23 and 27, after "of" insert -- respective --;
Lines 38 and 40, after "first" insert -- embodiment of a --;
Line 43, change "others" to -- other conductive material --;
Line 52, "bottom" to -- bottoms -- and change "Part of the rewriting circuit" to -- Respective terminal ends 120a of the rewriting circuits --;
Line 53, change "is continued" to -- extend through the corresponding perforations and are connected -- and change "electrode" to -- electrodes --;
Line 54, change "bottom of the perforation" to -- bottoms of the corresponding perforations --;
Line 55, change "circuit 120 is" to -- circuits 120 are -- and change "electrode" to-- electrodes --;
Line 58, change "in part" to -- as, or on, opposite terminal ends 120b -- and change "The" (second occurrence) to -- Each --;
Line 59, change "140 made of conductor" to -- 140 is made of a conductor -- and after "point" insert -- and --;

UNITED STATES PATENT AND TRADEMARK OFFICE
CERTIFICATE OF CORRECTION

PATENT NO. : 6,344,695 B1
DATED : February 5, 2002
INVENTOR(S) : Kei Murayama

It is certified that error appears in the above-identified patent and that said Letters Patent is hereby corrected as shown below:

Column 4, (continued)
Line 60, after "the" insert -- corresponding --;
Line 61, change "The" to -- Each -- and after "140" insert --, as --;
Line 62, after "shape" insert -- and is --.

Column 5,
Line 3, change "a surface" to -- exposed surfaces -- and delete "the peripheral";
Line 4, delete "region thereof" and after "140" insert -- are --;
Line 5, change "are inserted into" to -- by being inserted into and through --;
Lines 11 and 14, after "perforations" insert -- 180 --;
Line 15, after "outside" insert -- of and projecting from --;
Line 16, change "bump" to -- bumps --;
Line 21, before "semiconductor" insert -- a -- and after "possible" insert -- , --;
Line 22, after "160" insert -- , --;
Line 26, change "the perforation 180 of the" to -- the respective perforation 180 in the --;
Line 28, after "outside" insert -- (i.e., projects beyond) --;
Line 32, change "to get out" to -- , and getting out -- and change "or disappear" to -- or even disappearing --;
Line 33, after "of" insert -- a --;
Line 37, change "projected" to -- projecting --;
Line 40, after "located" insert -- either --;
Line 41, change "projected" to -- so as to project --;
Line 42, after "200" insert -- , --;
Line 44, delete "being";
Line 45, change "interfered" to -- interfering --;
Line 46, change "FIG. 9 or 10" to -- FIGS. 9 and 10 --;
Line 47, after "shape" insert -- , -- and change "toward outside" to -- toward the outside surface --;
Line 51, change "diverged" to -- which diverges --;
Line 52, change "outside" to -- the outside, or exterior, surface --;
Line 55, after "with" insert -- by --;
Line 61, after "second" insert -- embodiment of a -- and change "device, the conductor" to -- device of FIG. 11, each conductor --;
Line 62, after "122" insert -- is --, after "the" insert -- respective -- and delete "is";
Line 63, change "the perforation" to -- the corresponding perforation --;
Line 65, change "a surface" to -- exposed surfaces -- and delete "in the peripheral region";
Line 66, delete "of the rewiring circuit";

UNITED STATES PATENT AND TRADEMARK OFFICE
CERTIFICATE OF CORRECTION

PATENT NO. : 6,344,695 B1
DATED : February 5, 2002
INVENTOR(S) : Kei Murayama

It is certified that error appears in the above-identified patent and that said Letters Patent is hereby corrected as shown below:

Column 6,
Line 1, change "The" to -- Each -- and after "200" insert -- , --;
Line 2, after "diameter" insert -- , --;
Line 4, after "the" (first occurrence) insert -- corresponding --;
Line 5, after "of" insert -- , i.e., beyond the surface of, --;
Line 8, change "device except for" to -- device embodiment --;
Line 9, delete "that resulted from a fact";
Line 10, change "device, the outer" to -- device embodiment, each outer --;
Line 11, change "the" to -- a respective --;
Line 15, after "second" insert -- embodiment --;
Line 16, change "the" to -- respective --;
Line 21, change "the molten" to -- each molten -- and "contact with the" to -- contact with the corresponding --;
Line 22, before "perforation" insert -- respective --;
Line 25, change "a position" to -- the position of the --;
Line 26, delete "to the";
Line 27, after "outside" insert -- (i.e., beyond the exposed surface of) --;
Line 34, delete "for that resulted from a fact" and after "first" insert -- embodiment of a --;
Line 37, after "second" insert -- embodiment of a --;
Line 38, change "diverged" to -- diverging --;
Line 43, "after "200" insert -- , --;
Line 44, after "160" insert -- , --;
Line 52, delete "the";
Line 53, change "device and, instead, replace" to -- devices and, instead, to replace --.

This certificate supersedes Certificate of Correction issued September 3, 2002

Signed and Sealed this

Nineteenth Day of November, 2002

*Attest:*

*Attesting Officer*

JAMES E. ROGAN
*Director of the United States Patent and Trademark Office*